(12) United States Patent
Wang

(10) Patent No.: US 6,974,757 B2
(45) Date of Patent: Dec. 13, 2005

(54) METHOD OF FORMING SILICON-ON-INSULATOR COMPRISING INTEGRATED CIRCUITRY

(75) Inventor: Zhongze Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/607,869

(22) Filed: Jun. 27, 2003

(65) Prior Publication Data

US 2004/0089863 A1 May 13, 2004

Related U.S. Application Data

(62) Division of application No. 10/340,126, filed on Jan. 10, 2003, now Pat. No. 6,864,155, which is a division of application No. 10/051,981, filed on Jan. 16, 2002.

(51) Int. Cl.[7] ............................................. H01L 21/30
(52) U.S. Cl. ........................ 438/455; 438/459; 438/404
(58) Field of Search ............................... 257/347–354; 438/149, 151, 455, 459, 406

(56) References Cited

U.S. PATENT DOCUMENTS

| | | | |
|---|---|---|---|
| 5,021,843 A | | 6/1991 | Ohmi |
| 5,374,329 A | | 12/1994 | Miyawaki .................... 156/630 |
| 5,405,802 A | * | 4/1995 | Yamagata et al. ........... 438/459 |
| 5,453,394 A | * | 9/1995 | Yonehara et al. ........... 438/455 |
| 5,670,411 A | * | 9/1997 | Yonehara et al. ........... 438/459 |
| 5,767,020 A | | 6/1998 | Sakaguchi et al. .......... 438/705 |
| 5,773,355 A | | 6/1998 | Inoue et al. ................ 438/459 |
| 5,841,171 A | * | 11/1998 | Iwamatsu et al. ........... 257/347 |
| 5,849,627 A | | 12/1998 | Linn et al. .................. 438/456 |
| 5,882,532 A | | 3/1999 | Field et al. ..................... 216/2 |
| 5,910,672 A | * | 6/1999 | Iwamatsu et al. ........... 257/347 |
| 6,010,921 A | | 1/2000 | Soutome ..................... 438/151 |
| 6,037,634 A | * | 3/2000 | Akiyama ..................... 257/347 |
| 6,048,411 A | * | 4/2000 | Henley et al. ............. 148/33.5 |
| 6,071,783 A | | 6/2000 | Liang et al. |
| 6,091,076 A | | 7/2000 | Deleonibus |
| 6,215,155 B1 | | 4/2001 | Wollesen |
| 6,245,636 B1 | | 6/2001 | Maszara |
| 6,255,731 B1 | | 7/2001 | Ohmi et al. ................ 257/758 |
| 6,265,327 B1 | | 7/2001 | Kobayashi et al. ......... 438/776 |
| 6,268,630 B1 | | 7/2001 | Schwank et al. |
| 6,313,014 B1 | * | 11/2001 | Sakaguchi et al. .......... 438/475 |
| 6,340,829 B1 | | 1/2002 | Hirano et al. |
| 6,346,729 B1 | | 2/2002 | Liang et al. |
| 6,350,703 B1 | * | 2/2002 | Sakaguchi et al. .......... 438/766 |
| 6,358,791 B1 | | 3/2002 | Hsu et al. |
| 6,403,485 B1 | | 6/2002 | Quek et al. |

(Continued)

OTHER PUBLICATIONS

*Floating Body Effects*, SOI Circuit Design Concepts: SOI Device Electrical Properties, pp. 34-53 (pre-Aug. 2001).

(Continued)

*Primary Examiner*—Jennifer Kennedy
(74) *Attorney, Agent, or Firm*—Wells St. John P.S.

(57) ABSTRACT

A wafer bonding method of forming silicon-on-insulator comprising integrated circuitry includes nitridizing at least a portion of an outer surface of silicon of a device wafer. After the nitridizing, the device wafer is joined with a handle wafer. A method of forming silicon-on-insulator comprising integrated circuitry includes nitridizing an interface of the silicon comprising layer of silicon-on-insulator circuitry with the insulator layer of the silicon-on-insulator circuitry. After the nitridizing, a field effect transistor gate is formed operably proximate the silicon comprising layer. Other methods are disclosed. Integrated circuitry is contemplated regardless of the method of fabrication.

18 Claims, 3 Drawing Sheets

U.S. PATENT DOCUMENTS

| | | |
|---|---|---|
| 6,410,938 B1 | 6/2002 | Xiang |
| 8,433,401 | 8/2002 | Clark et al. ............... 257/524 |
| 6,509,613 B1 | 1/2003 | En et al. .................... 257/349 |
| 6,512,244 B1 | 1/2003 | Ju et al. ...................... 257/59 |
| 6,531,375 B1 | 3/2003 | Giewont et al. ........... 438/407 |
| 6,534,380 B1 | 3/2003 | Yamauchi et al. ......... 438/455 |
| 6,541,861 B2 | 4/2003 | Higashi et al. ............ 257/751 |
| 6,552,396 B1 | 4/2003 | Bryant et al. |
| 6,552,496 B2 | 4/2003 | Yamazaki ............... 315/169.3 |
| 6,610,615 B1 | 8/2003 | McFadden et al. ........ 438/776 |
| 6,642,579 B2 | 11/2003 | Fung |
| 6,649,959 B2 | 11/2003 | Hsu et al. |
| 6,661,065 B2 * | 12/2003 | Kunikiyo .................. 257/411 |
| 6,664,146 B1 * | 12/2003 | Yu ............................ 438/149 |
| 6,680,243 B1 | 1/2004 | Kamath et al. ............ 438/526 |
| 2001/0020722 A1 * | 9/2001 | Yang ......................... 257/347 |
| 2002/0011670 A1 | 1/2002 | Higashi et al. ............ 257/751 |
| 2002/0034844 A1 | 3/2002 | Hsu et al. |
| 2002/0048844 A1 | 4/2002 | Sakaguchi |
| 2002/0070454 A1 * | 6/2002 | Yasukawa ................. 257/760 |
| 2002/0134503 A1 | 9/2002 | Hussinger et al. ....... 156/331.4 |
| 2003/0085424 A1 * | 5/2003 | Bryant et al. .............. 257/347 |

OTHER PUBLICATIONS

U.S. Appl. No. 10/924,776, filed Aug. 25, 2004, Ford.

Bashir et al., *Characterization of sidewall defects in selective epitaxial growth of silicon*, 13 J. Vac. SCI. Technol. B, No. 3, pp. 923-927 (May/Jun. 1995).

Bashir et al., *Reduction of sidewall defect induced leakage currents by the use of nitrided field oxides in silicon selective epitaxial growth . . .*, 18 J. Vac. Sci. Technol. B, No. 2, pp. 695-699 (Mar./Apr. 2000).

Hammad et al., *The Pseudo-Two-Dimensional Approach to Model the Drain Section in SOI MOSFETs*, 48 IEEE Transactions on Electron Devices, No. 2, pp. 386-387 (Feb. 2001).

Sivagnaname et al., *Stand-by Current in PD-SOI Pseudo-nMOS Circuits*, IEEE, pp. 95-96 (Jun. 2003).

Wang et al., *Achieving Low Junction Capacitance on Bulk SI MOSFET Using SDOI Process*, Micron Technology, Inc., 12 pages (pre-2004).

* cited by examiner

METHOD OF FORMING SILICON-ON-INSULATOR COMPRISING INTEGRATED CIRCUITRY

RELATED PATENT DATA

This patent resulted from a divisional application of U.S. patent application Ser. No. 10/340,126, filed Jan. 10, 2003, now U.S. Pat. No. 6,864,155, entitled "Methods of Forming Silicon-on-Insulator Comprising Integrated Circuitry, and Wafer Bonding Methods of Forming Silicon-on-Insulator Comprising Integrated Circuitry", naming Zhongze Wang as inventor, the disclosure of which is incorporated by reference; which patent resulted from a divisional application of U.S. patent application Ser. No. 10/051,981, filed Jan. 16, 2002, entitled "Silicon-on-Insulator Comprising Integrated Circuitry", naming Zhongze Wang as inventor, the disclosure of which is incorporated by reference.

TECHNICAL FIELD

This invention relates to silicon-on-insulator comprising integrated circuitry and to methods of forming silicon-on-insulator comprising integrated circuitry, including wafer bonding methods.

BACKGROUND OF THE INVENTION

A problem which motivated the invention related to overcoming undesired floating body effects inherent in silicon-on-insulator field effect transistors. Such is characterized by channel region voltage inherently floating during operation, thereby affecting the threshold voltage and operation consistency of the transistor. Floating body effect typically is not an issue in bulk semiconductor circuitry, as the bulk substrate is tied or held to a specific voltage such that the substrate voltage and threshold voltage are not allowed to float. However in silicon-on-insulator field effect transistors, such does not presently occur and is particularly problematic in what are known as partially depleted silicon-on-insulator transistors. A partially depleted silicon-on-insulator transistor has its channel region only partially extending through the thickness of the silicon layer beneath the transistor gate. Factors which determine whether a field effect transistor is partially or fully depleted include the thickness of the silicon layer and the thickness of the source/drain region within the silicon layer.

Floating body effect or voltage is determined by forward current leakage to the source and reverse leakage to the drain. One known prior art method of reducing the floating body effect is to increase the source/drain junction forward bias current, thus resulting in any charge buildup in the body promptly being discharged to the source.

The following invention was motivated in addressing the above identified problems, although such is in no way so limited. The invention is limited only by the accompanying claims as literally worded without limiting reference to the specification, and in accordance with the doctrine of equivalents.

SUMMARY

The invention includes silicon-on-insulator comprising integrated circuitry and methods of forming silicon-on-insulator circuitry, including wafer bonding methods. In one implementation, a wafer bonding method of forming silicon-on-insulator comprising integrated circuitry includes nitridizing at least a portion of an outer surface of silicon of a device wafer. After the nitridizing, the device wafer is joined with a handle wafer.

In one implementation, a method of forming silicon-on-insulator comprising integrated circuitry includes nitridizing an interface of the silicon comprising layer of silicon-on-insulator circuitry with the insulator layer of the silicon-on-insulator circuitry. After the nitridizing, a field effect transistor gate is formed operably proximate the silicon comprising layer.

In one implementation, a method of forming silicon-on-insulator comprising integrated circuitry includes forming the silicon comprising layer of the silicon-on-insulator circuitry. A pair of source/drain regions are formed in the silicon comprising layer and a channel region is formed in the silicon comprising layer which is received intermediate the source/drain regions. A transistor gate is formed operably proximate the channel region. The insulator layer of the silicon-on-insulator circuitry is formed. The insulator layer is formed to comprise a first silicon dioxide comprising region in contact with the silicon comprising layer and running along at least a portion of the channel region between the source/drain regions. A silicon nitride comprising region is formed in contact with the first silicon dioxide comprising region and runs along at least a portion of the channel region. A second silicon dioxide comprising region is formed in contact with the silicon nitride comprising region. The silicon nitride comprising region is received intermediate the first and second silicon dioxide comprising regions.

Integrated circuitry is also contemplated regardless of the method of fabrication.

BRIEF DESCRIPTION OF THE DRAWINGS

Preferred embodiments of the invention are described below with reference to the following accompanying drawings.

FIG. 3 is a view of the. FIG. 2 wafer at a processing step subsequent to that shown by FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
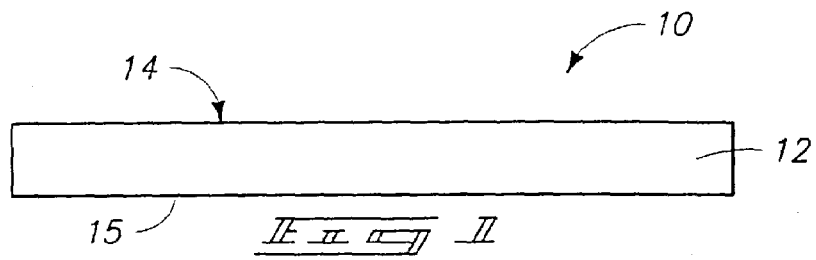
FIG. 1 is a diagrammatic view of a wafer in process in accordance with an aspect of the invention.

A first embodiment of a method of forming silicon-on-insulator comprising integrated circuitry is described with reference to FIGS. 1–6, and comprises a wafer bonding method. FIG. 1 depicts a device wafer or first substrate 10. Preferably, such comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Substrate 12 includes an outer surface 14. Some portion 15 thereof is intended to be joined with another substrate, as will be apparent from the continuing discussion in a preferred wafer bonding method of forming silicon-on-insulator comprising integrated circuitry. In the depicted and preferred embodiment, outer surface 14 comprises crystalline silicon.

Figure 2:
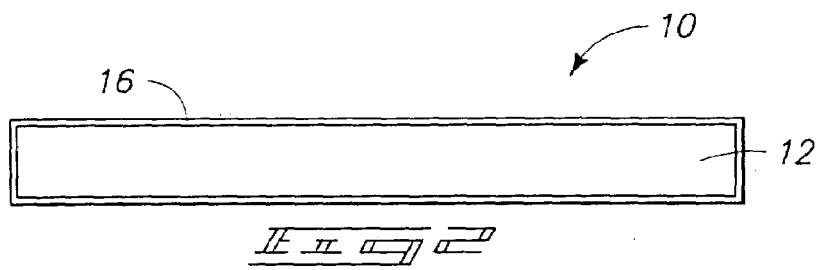
FIG. 2 is a view of the FIG. 1 wafer at a processing step subsequent to that shown by FIG. 1.

Referring to FIG. 2, at least a portion of outer silicon surface of device wafer 10 is nitridized, with the depicted portion including portion 15 and all of outer surface 14, to form a silicon nitride comprising region 16. By way of example only, such nitridizing might include any one or combination of ion implanting, direct plasma nitridation, remote plasma nitridation, and chemical vapor deposition. The nitridation might also be conducted to be void of either direct or remote nitrogen containing plasma exposure, for example by furnace annealing in a nitrogen containing atmosphere. Example nitrogen containing species for any of the above include $N_2$, $NO_x$, $NH_3$ and $N_2O$. A preferred thickness for region 16 is from about 5 Angstroms to about 50 Angstroms.

Figure 3:
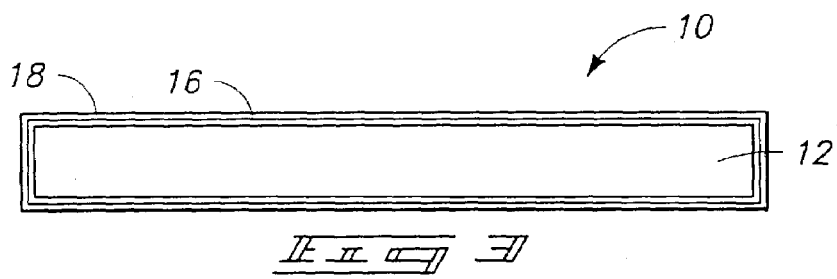

Referring to FIG. 3, at least a portion of nitride comprising layer 16 is oxidized, preferably to form a silicon dioxide or silicon oxynitride layer 18. In one preferred embodiment, nitride comprising layer 16 has a thickness of from about 5 Angstroms to about 50 Angstroms at the conclusion of the oxidizing. An exemplary thickness for oxide layer 18 is from about 50 Angstroms to about 500 Angstroms.

Figure 4:
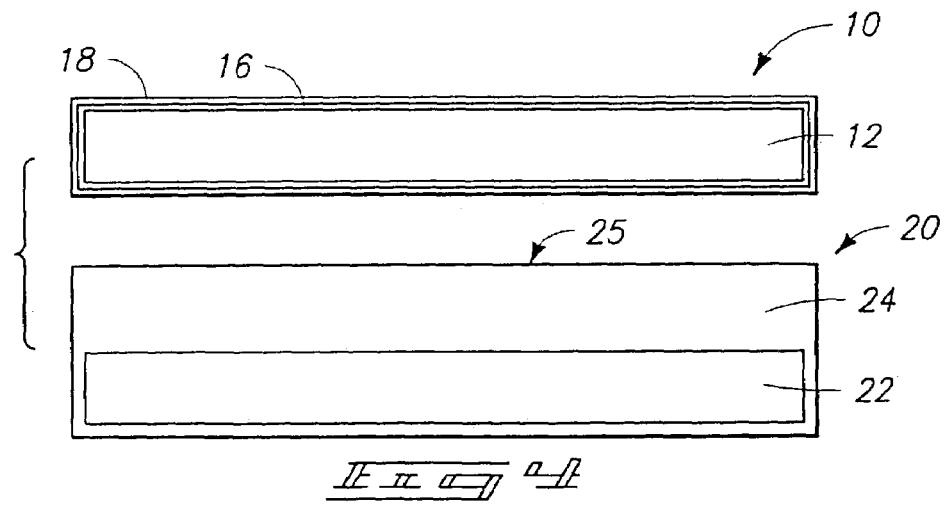
FIG. 4 is a view of the FIG. 3 wafer at a processing step subsequent to that shown by FIG. 3, and positioned relative to another wafer.

Referring to FIG. 4, device wafer or first substrate 10 is depicted diagrammatically proximate a handle wafer or second substrate 20. Second substrate 20 also preferably comprises a bulk monocrystalline silicon substrate 22 which has been oxidized to form a silicon dioxide comprising layer 24. An example process for forming layer 24 includes thermal growth or deposition, for example by CVD. For purposes of the continuing discussion, handle wafer 20 can be considered as comprising a silicon dioxide comprising surface 25.

Figure 5:
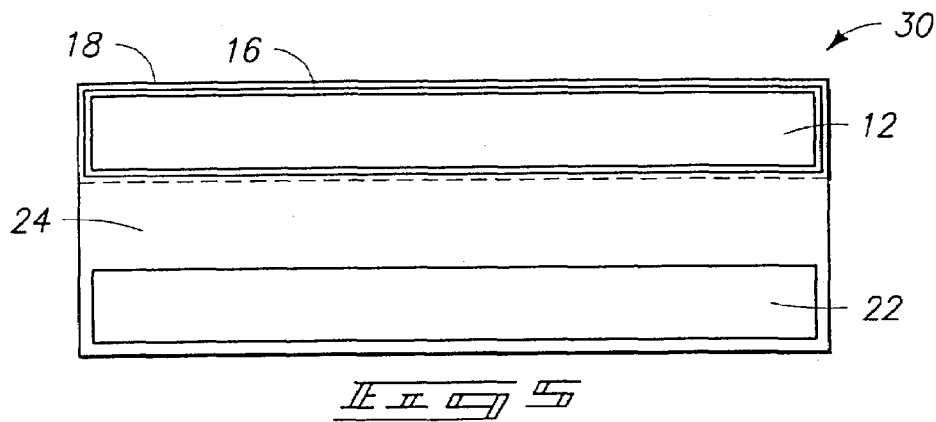
FIG. 5 is a view of the FIG. 4 wafers at a processing step subsequent to that shown by FIG. 4.

Referring to FIG. 5, device wafer 10 is joined with handle wafer 20, with the preferred embodiment depicting joining device wafer 10 with silicon dioxide comprising surface 25 of handle wafer 20. Such forms a joined substrate 30. Such comprises but one preferred embodiment of an aspect of the invention. Such aspect includes a wafer bonding method of forming silicon-on-insulator comprising integrated circuitry whereby the method comprises nitridizing at least a portion of an outer surface of silicon of a device wafer. Thereafter, the device wafer is joined with the handle wafer and regardless of what subsequent processing occurs to finally form integrated circuitry. One exemplary method to bond substrate 10 with substrate 20 includes applying a suitable high voltage with opposite polarity on the device wafer and on the handle wafer. Pressing the substrates together at elevated temperature and pressure can also result in a suitable bonding. Further, by way of example only and if the oxide layer is very thin, a thermal oxidation can be conducted while pressing them together at high pressure.

Figure 6:
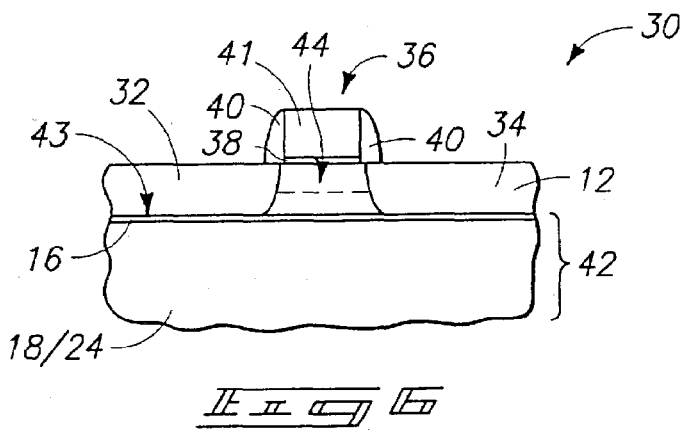
FIG. 6 is an enlarged diagrammatic sectional view of a portion of the joined wafers of FIG. 5 after subsequent processing.

The most preferred embodiment ultimately includes forming the integrated circuitry to comprise a silicon-on-insulator field effect transistor, for example and by way of example only, that depicted by FIG. 6. FIG. 6 depicts joined substrate 30 having been polished or otherwise etched back to form the depicted silicon comprising material 12 from what was the independent device wafer 10. Further thinning of joined substrate 30 can be accomplished by polishing or chemical/etching means, if desired. An exemplary thickness for material 12 in FIG. 6 is from about 1000 Angstroms to about 2000 Angstroms. A pair of source/drain regions 32 and 34 has been formed within silicon comprising layer 12. A gate construction 36 overlies silicon comprising layer 12 intermediate source/drain regions 32 and 34. Such is diagrammatically shown to include a gate dielectric layer 38, insulative sidewall spacers 40, and a conductive transistor gate region 41. Exemplary materials for layers 38 and 40 include silicon dioxide and silicon nitride, with exemplary materials for gate region 41 including conductively doped polysilicon and silicides.

In the depicted and preferred embodiment, layers/regions 16/18/24 comprise an insulator layer 42 of the silicon-on-insulator circuitry which contacts silicon comprising layer 12. Such results in the formation of an interface 43 of silicon comprising layer 12 of the silicon-on-insulator circuitry with insulator layer 42 of the silicon-on-insulator circuitry. Source/drain regions 32 and 34, as shown, extend to be in contact with insulator layer 42. Also in the depicted and preferred embodiment, source/drain regions 32 and 34 and transistor gate construction 36 form a channel region 44 which is received intermediate the source/drain regions, and in the preferred embodiment, is partially depleted (not extending completely through the thickness of silicon comprising layer 12) in operation, as shown. Regardless, nitridized portion 16 is received intermediate source/drain regions 32, 34 and silicon dioxide 18/24. Silicon nitride comprising region 16 ideally has greater leakage current characteristics whereby increased leakage current can occur across that portion of silicon comprising layer 12 received between source/drain regions 32 and 34 than would otherwise occur in the absence of silicon nitride comprising region 16. Alternately considered, and in no way by means of limitation, source/drain forward bias current and leakage are increased, which preferably increases trap density and reduces carrier lifetime, which results in higher junction current.

The above describes but one exemplary preferred embodiment of nitridizing an interface of a silicon comprising layer of silicon-on-insulator circuitry with an insulator of the silicon-on-insulator circuitry. After such nitridizing, a field effect transistor gate is formed operably proximate the silicon nitride comprising layer. The above-described preferred embodiment comprises forming the circuitry by joining a first substrate comprising the silicon comprising layer with a second, substrate comprising the insulator layer to form a joined substrate. In the above-described, depicted preferred embodiment, the nitridizing includes nitridizing at least one of the first and second substrates prior to the joining. Accordingly, either or both of the substrates could be nitridized prior to the joining. By way of example only, the invention also contemplates nitridizing at least a portion of an outer surface of silicon dioxide comprising layer 24 of handle wafer 20 with or without any nitridation or oxidation of any portion of the outer surface of device wafer 10. Accordingly, in such embodiment, the outer surface of the device wafer to which the handle wafer is joined might comprise crystalline silicon, silicon nitride and/or silicon dioxide.

The invention also contemplates a lesser preferred embodiment wherein the nitridizing of the interface occurs after forming the joined substrate. For example, the FIG. 6 construction might be formed by conducting an ion implant after joining to form silicon nitride comprising region 16.

Regardless of the method of fabrication, the invention also contemplates silicon-on-insulator comprising integrated circuitry, by way of example only, such as the integrated circuitry depicted by FIG. 6. The invention contemplates a substrate comprising an insulator layer of silicon-on-insulator circuitry where such insulator layer comprises silicon dioxide. The silicon-on-insulator circuitry comprises a semiconductive silicon comprising layer received proximate the insulator layer, with the silicon comprising layer comprising a pair of source/drain regions formed therein and a channel region formed therein which is received intermediate the source/drain regions. A transistor gate is received operably proximate the channel region. A silicon nitride comprising region is received intermediate the silicon dioxide comprising layer and the source/drain regions, and runs along at least a portion of the channel region between the source/drain regions.

Figure 7:
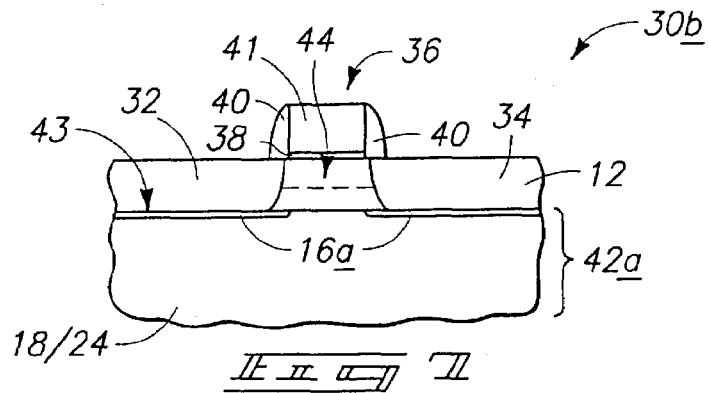
FIG. 7 is a view of an alternate embodiment to that depicted by FIG. 6.
Figure 8:
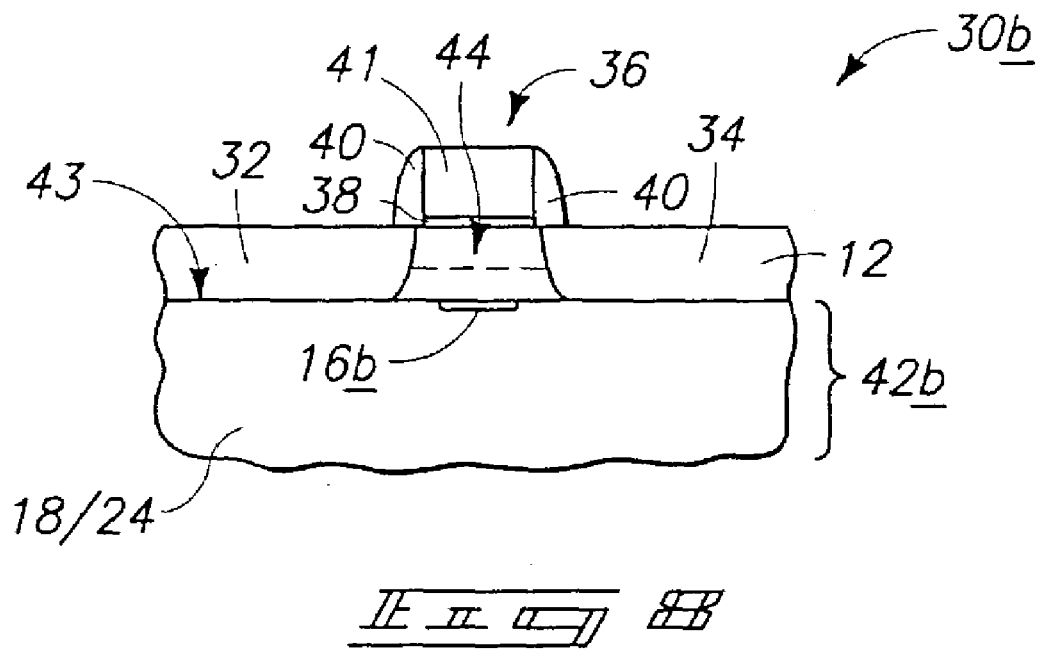
FIG. 8 is a view of another alternate embodiment to that depicted by FIG. 6.

FIG. 6 depicts a construction whereby a silicon nitride comprising region 16 runs entirely along and against the channel region between the source/drain regions. FIGS. 7 and 8 depict alternate embodiments 30*a* and 30*b* comprising, alternate silicon nitride comprising regions 16*a* and 16*b*, respectively. Like numerals from the first described embodiment are utilized where appropriate, with differences being indicated by the respective suffixes "a" and "b". By way of example only, each of FIGS. 7 and 8 show alternate embodiments wherein the respective silicon nitride comprising regions run only along a portion of channel region 44 between source/drain regions 32 and 34.

Figure 9:
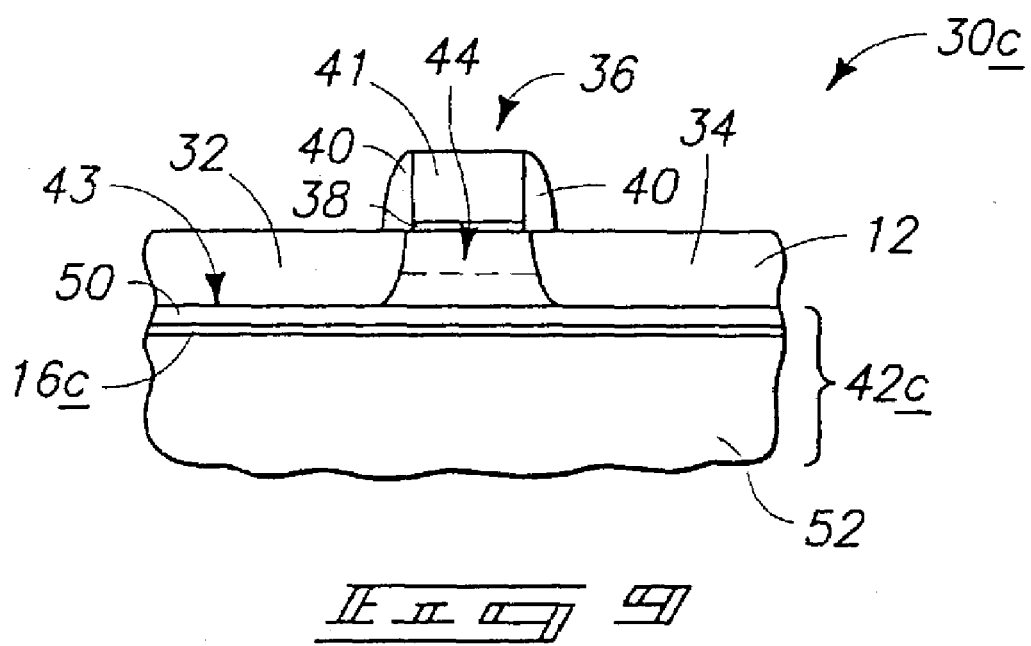
FIG. 9 is a view of still another alternate embodiment to that depicted by FIG. 6.

Further by way of example only, FIG. 9 depicts an alternate construction contemplated in both a method and in circuitry independent of the method in accordance with aspects of the invention. FIG. 9 depicts a wafer fragment 30*c* comprising an alternate embodiment silicon nitride comprising region 16*c*. Such could, by way of example only, be formed by any of the nitridation and joining methods described above. Like numerals from the first described embodiment are utilized where appropriate, with differences being indicated with the suffix "c". Insulator layer 42*c* is formed to comprise a first silicon dioxide comprising region 50 in contact with silicon comprising layer 12 and running along at least a portion of channel region 44 between source/drain regions 32 and 34. An exemplary thickness for region 50 is from about 10 Angstroms to 30. Angstroms. Silicon nitride comprising region 16*c* is formed in contact with first silicon dioxide comprising region 50 and runs along at least a portion of channel region 44. A second silicon dioxide comprising region 52 is formed in contact with silicon nitride comprising region 16*c*, with silicon nitride comprising region 16*c* being received intermediate first silicon dioxide comprising region 50 and second silicon dioxide comprising region 52.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming silicon-on-insulator comprising integrated circuitry, comprising:
   forming a silicon-comprising layer of the silicon-on-insulator circuitry;
   forming an insulator layer of the silicon-on-insulator circuitry, the insulator layer being formed to comprise:
   a first silicon dioxide-comprising region in contact with the silicon-comprising layer;
   a silicon nitride-comprising region in contact with the first silicon dioxide-comprising region; and
   a second silicon dioxide-comprising region in contact with the silicon nitride-comprising region, the silicon nitride-comprising region being received intermediate the first and second silicon dioxide-comprising regions, the forming the insulator layer comprising forming a first silicon dioxide layer on a first substrate, forming a second silicon dioxide layer on a second substrate and joining the first substrate to the second substrate;
   forming a pair of source/drain regions in the silicon-comprising layer, each of the source/drain regions extending to the insulator layer;
   forming a channel region in the silicon-comprising layer which is received intermediate the source/drain regions, the channel region extending less than completely through a thickness of the silicon-comprising layer, the silicon nitride-comprising region running along only a portion of the channel region and the first silicon dioxide-comprising running along at least a portion of the channel region; and
   forming a transistor gate operably proximate the channel region.

2. The method of claim 1 comprising forming the silicon nitride-comprising region comprising nitridizing at least one of the first and second substrates prior to the joining.

3. The method of claim 2 wherein the nitridizing comprises ion implanting.

4. The method of claim 2 wherein the nitridizing comprises direct plasma nitridation.

5. The method of claim 2 wherein the nitridizing comprises remote plasma nitridation.

6. The method of claim 2 wherein the nitridation is void of either direct or remote nitrogen containing plasma exposure.

7. The method of claim 1 comprising, forming the silicon nitride-comprising region comprising nitridizing after the joining.

8. The method of claim 7 wherein the nitridizing comprises ion implanting.

9. The method of claim 7 wherein the nitridizing comprises direct plasma nitridation.

10. The method of claim 7 wherein the nitridizing comprises remote plasma nitridation.

11. The method of claim 7 wherein the nitridation is void of either direct or remote nitrogen containing plasma exposure.

12. The method of claim 7 comprising forming the silicon nitride-comprising region to have a thickness of from about 10 Angstroms to about 50 Angstroms.

13. The method of claim 7 comprising forming the first silicon dioxide-comprising region to have a thickness of from about 10 Angstroms to about 50 Angstroms.

14. A method of forming silicon-on-insulator comprising integrated circuitry, comprising:
   forming a silicon-comprising layer;
   forming an insulator layer, the insulator layer being formed comprising:
      a first silicon-dioxide-comprising region in contact with the silicon-comprising layer;
      a silicon nitride-comprising region in contact with the first silicon dioxide-comprising region; and
      a second silicon dioxide-comprising region in contact with the silicon nitride comprising region, the silicon nitride-comprising region being received intermediate the first and second silicon dioxide-comprising regions;
   forming a pair of source/drain regions in the silicon-comprising layer, each of the source/drain regions extending to the insulator layer;
   forming a channel region in the silicon-comprising layer which is received intermediate the source/drain regions, the channel region extending less than completely through a thickness of the silicon-comprising layer, the silicon nitride-comprising region running along only a portion of the channel region; and
   forming a gate structure operably proximate the channel region.

15. The method of claim 14 wherein the forming the insulator layer further comprises:
   forming a first silicon oxide material over a first substrate;
   forming a second silicon oxide material over a second substrate; and
   joining the first and second substrates to form a joined substrate.

16. The method of claim 15 wherein the joining comprises applying a voltage to the first substrate and the second substrate.

17. The method of claim 15 further comprising, after joining the first and second substrates, thinning the joined substrate.

18. The method of claim 17 wherein the thinning comprises removal of a portion of the silicon-comprising layer.

* * * * *

UNITED STATES PATENT AND TRADEMARK OFFICE
CERTIFICATE OF CORRECTION

| | | |
|---|---|---|
| PATENT NO. | : 6,974,757 B2 | |
| APPLICATION NO. | : 10/607869 | |
| DATED | : December 13, 2005 | |
| INVENTOR(S) | : Wang | |

It is certified that error appears in the above-identified patent and that said Letters Patent is hereby corrected as shown below:

Title Page 2, U.S. Patent Documents, (56) Line 2 - Replace "8,433,401" with --6,433,401 B1--.

Column 4, Line 62 - Delete "," after "second".

Column 5, Line 57 - Delete "." after "30".

Column 6, Line 39 - Replace "-comprising" with --layer--.

Column 7, Line 11 - Replace "comprising" with --to comprise--.

Signed and Sealed this

Fifth Day of December, 2006

JON W. DUDAS
*Director of the United States Patent and Trademark Office*